US008741750B2

(12) United States Patent  (10) Patent No.: US 8,741,750 B2
Hille et al.  (45) Date of Patent: Jun. 3, 2014

(54) METHOD FOR FABRICATING A SEMICONDUCTOR HAVING A GRADED PN JUNCTION

(75) Inventors: Frank Hille, Munich (DE); Franz Josef Niedernostheide, Muenster (DE); Hans-Joachim Schulze, Taufkirchen (DE); Holger Schulze, Villach (AT)

(73) Assignee: Infineon Technologies Austria AG, Villach (AT)

( * ) Notice: Subject to any disclaimer, the term of this patent is extended or adjusted under 35 U.S.C. 154(b) by 619 days.

(21) Appl. No.: 12/571,037

(22) Filed: Sep. 30, 2009

(65) Prior Publication Data

US 2010/0087053 A1  Apr. 8, 2010

(30) Foreign Application Priority Data

Sep. 30, 2008  (DE) .......................... 10 2008 049 664

(51) Int. Cl.
    *H01L 21/26*  (2006.01)
(52) U.S. Cl.
    USPC ........................................................ 438/535
(58) Field of Classification Search
    USPC .............. 438/535, 520, 528, 527, 549
    See application file for complete search history.

(56) References Cited

U.S. PATENT DOCUMENTS

| | | | |
|---|---|---|---|
| 7,195,994 B2* | 3/2007 | Schulze et al. | 438/514 |
| 7,358,127 B2* | 4/2008 | Nemoto | 438/197 |
| 7,514,750 B2* | 4/2009 | Mauder et al. | 257/362 |
| 2002/0020893 A1* | 2/2002 | Lhorte | 257/481 |
| 2004/0219769 A1* | 11/2004 | Voldman et al. | 438/528 |
| 2006/0084248 A1* | 4/2006 | Ranade et al. | 438/520 |
| 2006/0086991 A1* | 4/2006 | Barthelmess et al. | 257/401 |
| 2007/0007587 A1* | 1/2007 | Barthelmess et al. | 257/330 |
| 2009/0197368 A1* | 8/2009 | Sivaram et al. | 438/73 |

FOREIGN PATENT DOCUMENTS

| | | |
|---|---|---|
| DE | 102005031398 | 1/2007 |
| DE | 10240107 | 3/2008 |
| DE | 102007033873 | 1/2009 |

* cited by examiner

*Primary Examiner* — Fernando L Toledo
*Assistant Examiner* — Neil Prasad
(74) *Attorney, Agent, or Firm* — Dicke, Billig & Czaja, PLLC

(57) ABSTRACT

A method for fabricating a semiconductor body is presented. The semiconductor body includes a p-conducting zone, an n-conducting zone and a pn junction in a depth $T_1$ in the semiconductor body between the p-conducting zone and the n-conducting zone. The method includes providing the semiconductor body, producing the p-doped zone by the diffusion of an impurity that forms an acceptor in a first direction into the semiconductor body, and producing the n-conducting zone by the implantation of protons in the first direction into the semiconductor body into a depth $T_2 > T_1$ and the subsequent heat treatment of the semiconductor body in order to form hydrogen-induced donors.

23 Claims, 4 Drawing Sheets

METHOD FOR FABRICATING A SEMICONDUCTOR HAVING A GRADED PN JUNCTION

CROSS-REFERENCE TO RELATED APPLICATIONS

This Utility Patent Application claims priority to German Patent Application No. DE 10 2008 049 664.2, filed on Sep. 30, 2008, and incorporated herein by reference.

BACKGROUND

The following description relates to exemplary embodiments of a method for fabricating a semiconductor body.

For specific types of power semiconductor components such as diodes, for example, a pn junction having a gradient of the acceptor and donor concentrations that is not too steep is desirable in order to counteractively control the dynamic avalanche, for example.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
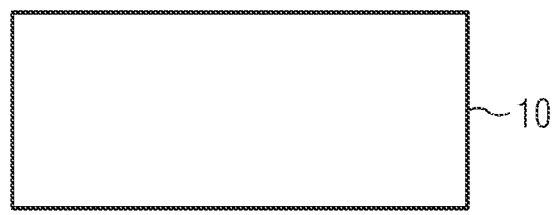
FIGS. 1a to d illustrate, in schematic cross-sectional views, one embodiment of an exemplary method for fabricating a semiconductor body having a pn junction.
Figure 1:
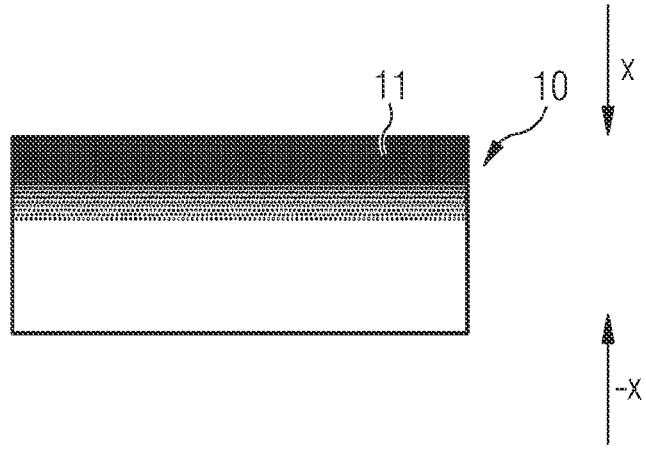
Figure 1:
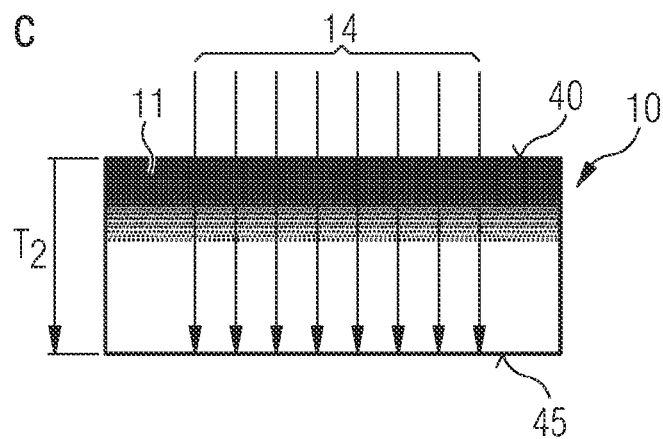
Figure 1:
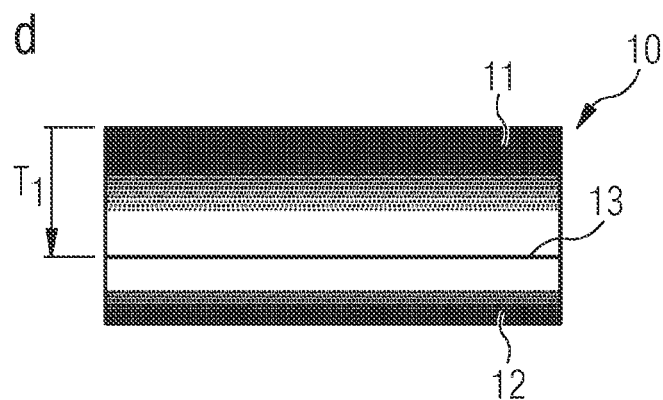

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Exemplary embodiments of the invention are explained in more detail below, with reference to the accompanying figures. However, the invention is not restricted to the embodiments specifically described, but rather can be modified and altered in a suitable manner. It lies within the scope of the invention to suitably combine individual features and feature combinations of one embodiment with features and feature combinations of another embodiment in order to arrive at further embodiments according to the invention.

Before the exemplary embodiments of the present invention are explained in more detail below with reference to the figures, it is pointed out that identical elements in the figures are provided with the same or similar reference symbols, and that a repeated description of these elements is omitted.

Furthermore, the figures are not necessarily true to scale; rather, the main emphasis is on elucidating the basic principle.

One or more embodiments provide a method which makes it possible to fabricate a semiconductor body having in each case a shallow gradient of the acceptor concentration of a p-conducting zone and of the donor concentration of an n-conducting zone in a direction toward the intervening pn junction.

One exemplary embodiment provides a method for fabricating a semiconductor body having a p-conducting zone, having an n-conducting zone and having a pn junction in a depth T1 in the semiconductor body between the p-conducting zone and the n-conducting zone. The method includes providing a semiconductor body, producing the p-conducting zone by the diffusion of an impurity that forms an acceptor in a first direction into the semiconductor body, producing the n-conducting zone by the implantation of protons in the first direction into the semiconductor body into a depth T2>T1 and the subsequent heat treatment of the semiconductor body in order to form hydrogen-induced donors.

In this case, the designation of an "impurity that forms an acceptor" encompasses the alternatives of an impurity which is itself already an acceptor or forms an acceptor in combination at least with a hydrogen implantation.

The outdiffusion of the impurity that forms an acceptor in the first direction produces a p-conducting zone having a decreasing acceptor concentration in the first direction. Furthermore, as a result of the deep implantation of protons with the subsequent heat treatment, the protons will diffuse in a second direction, opposite to the first direction. During the implantation into the semiconductor body, the protons produce defects in the crystal lattice of the semiconductor body. The defects are produced in that region of the semiconductor body through which the protons radiate.

Depending on the implantation energy, the protons have a maximum penetration depth into the semiconductor body, the "End-of-Range". Virtually all the implanted protons accumulate at this maximum penetration depth. The heat treatment brings about a diffusion of the protons in the semiconductor body, proceeding from the "End-of-Range", in one embodiment also in the second direction.

In the interplay of the protons with the defects in the crystal, the heat treatment additionally brings about the formation of hydrogen-induced donors. Consequently, there arises an n-conducting zone having a decreasing donor concentration in the second direction on account of the diffusion of the protons. The pn junction is formed at the location at which the donor concentration of the n-conducting zone falls below the acceptor concentration of the p-conducting zone. On account of the diffusion profile of the acceptor and donor concentrations that occurs on both sides at the pn junction, the gradient of the acceptor concentrations and also of the donor concentration, depending on the diffusion temperature and the diffusion time, can be made relatively shallow.

Moreover, protons can be implanted very deeply into the semiconductor body in comparison with the implantation of other dopants. It is thereby possible to form the pn junction very deeply in the semiconductor body, which can bring about improved switch-on properties of a semiconductor component fabricated with such a semiconductor body.

FIGS. 1a-1d illustrate one embodiment of a method for fabricating a semiconductor body.

FIG. 1a illustrates a semiconductor body 10 that is provided for the following method. The semiconductor body 10 should at least partly be composed of a semiconductor material which is suitable for forming hydrogen-induced donors. By way of example, silicon or gallium arsenide is suitable therefor. The semiconductor body 10 can, moreover, be provided in an undoped manner or in a manner already having an at least local basic doping. By way of example, a semiconductor body 10 having a low p-type basic doping, the basic dopant concentration of which is less than $1 \times 10^{15}$ cm$^{-3}$, is described here. The semiconductor body 10 can be, for example, an at least almost round slice, also referred to by experts as a wafer. The semiconductor body 10 can be constructed homogeneously from a semiconductor material and in one piece; however, it can also be composed of a plurality of semiconductor materials and/or of different layers or regions.

FIG. 1b illustrates a p-conducting zone 11 in the semiconductor body 10. The p-conducting zone 11 is produced by the diffusion of an impurity that forms an acceptor in a first direction x into the semiconductor body. As a result of the diffusion of the impurity, the p-conducting zone 11 has a decreasing acceptor concentration $N_A$ in the first direction x. This is indicated in FIG. 1b by a varying grey shading in the semiconductor body 10. All p-type dopants, that is to say all trivalent elements of the third group in the periodic system of chemical elements, in particular boron, are appropriate as the impurity.

However, the impurity used can also be a heavy metal which is suitable already per se or in combination with a hydrogen implantation for acceptor formation in the semiconductor body 10. In this case, the acceptors can be formed e.g., by the interstitial incorporation of the heavy metal at lattice vacancies or by the formation of complexes acting as an acceptor, where the complexes contain the heavy metal and/or vacancies of the semiconductor crystal lattice and/or hydrogen. In one embodiment, heavy metals that diffuse rapidly in the respective semiconductor body 10, that is to say heavy metals having a diffusion coefficient in the range of $1 \times 10^{-9}$ cm$^{-2}$/s to $1 \times 10^{-3}$ cm$^{-2}$/s in the semiconductor body 10, are suitable for achieving a deep p-conducting zone 11 on account of a deep diffusion of the heavy metal into the semiconductor body 10 with acceptable diffusion temperatures and times. By way of example, in an Si semiconductor body, platinum is suitable for a rapid diffusion, in one embodiment also because platinum exhibits the desired effect of producing acceptors in combination with a hydrogen implantation. With the use of platinum as the impurity, it is also possible, by way of example, to set the carrier life time of the charge carriers in a semiconductor component sought.

The diffusion of the respective impurity takes place for example at temperatures in the range of 700° C. to 1000° C., particularly if the diffusion takes place in silicon.

FIG. 1c illustrates an implantation of protons into the semiconductor body 10. The implantation of the protons is indicated by arrows 14. The protons are implanted right into a depth T2, the "End-of-Range", into the semiconductor body 10. The implantation 14 is effected via a first surface 40 of the semiconductor body 10 in a first direction x into the semiconductor body 10. In this case, the depth T2 can reach almost as far as a second surface 45 lying opposite the first surface 40. Complete radiation through the semiconductor body 10 should be avoided, because otherwise there are no longer any protons available into the semiconductor body 10 for the subsequent formation of an n-conducting zone 12. The depth T2 of the implantation can be set by way of the implantation energy of the protons. The depth T2, that is to say the maximum penetration depth of the protons and thus also the implantation energy is dimensioned on the basis of the depth T1 at which the subsequent pn junction 13 between the p-conducting zone 11 and the n-conducting zone 12 is intended to be situated. Furthermore, the depth T2 is dimensioned on the basis of the extent which the n-conducting zone 12 is intended to acquire. It holds true in any case that the penetration depth T2 of the protons is greater than the depth T1 of the pn junction 13. Indications regarding the depth T are always relative to the first surface 40 of the semiconductor body 10.

FIG. 1d illustrates the semiconductor body 10 with the p-conducting zone 11 and the n-conducting zone 12 produced after the proton implantation 14. The n-conducting zone 12 is formed with the aid of the implanted protons by heat treatment of the semiconductor body 10. During the implantation 14 of the protons into the semiconductor body 10, defects are produced in the crystal lattice of the semiconductor body 10 in that region of the semiconductor body 10 through which protons radiate. During the heat treatment of the semiconductor body 10, hydrogen-induced donors are produced in the interplay of the defects with the protons.

As a result of diffusion processes during the heat treatment therefore, an n-conducting zone 12 arises, proceeding from the "End-of-Range", that is to say from the region having the highest proton density, in the semiconductor body 10. The n-conducting zone 12 arises only in a second direction −x, opposite to the first direction x, because, proceeding from the "End-of-Range", defects were produced during the implantation 14 of the protons only in the second direction −x in the semiconductor body 10. By setting the temperature during the heat treatment and the duration of the application of temperature, it is possible to set the extent of the n-conducting zone 12 and the desired gradient of the donor concentration $N_D$. The pn junction 13 between the p-conducting zone 11 and the n-conducting zone 12 will form as soon as the donor concentration $N_D$ of the n-conducting zone 12 falls below the acceptor concentration $N_A$ of the p-conducting zone 11.

Through a suitable choice of the acceptor concentration profile, which can be set by using the diffusion temperature and diffusion duration of the impurity that forms the acceptor, and through a suitable choice of the donor concentration profile, which can likewise be set by using the diffusion temperature and diffusion duration, it is possible to define the depth T1 of the pn junction 13. One embodiment provides, for example, for the depth T1 of the pn junction 13 to be more than 15 μm. Another embodiment provides for the depth T1 of the pn junction 13 to correspond to more than 20% of the extent of the semiconductor body 10 in the first direction x.

One exemplary embodiment provides for the depth T1 to constitute more than 40% of the extent of the semiconductor body 10 in the first direction x. Moreover, the donor concentration profile of the n-conducting zone 12 can also be controlled by using the defect density and the proton concentration, which can be set by using the proton implantation dose and the subsequent annealing conditions. Exemplary values for implantation doses of the protons lie between $1\times10^{14}$ cm$^{-2}$ and $1\times10^{15}$ cm$^{-2}$. Examples of suitable heat treatment are thermal processes in the range of between 450° C. and 550° C. and a duration of the thermal processes in the range of 30 min to 12 h.

Figure 2:
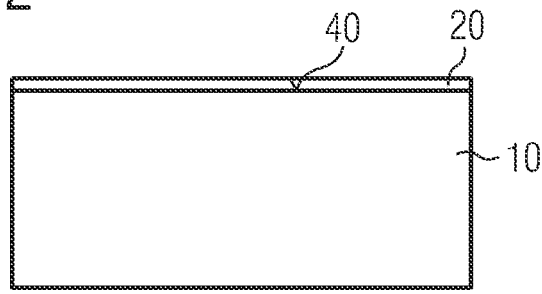
FIG. 2 is a schematic cross-sectional view, illustrating one exemplary embodiment of an impurity layer that forms an acceptor on a semiconductor body.

FIG. 2 illustrates an exemplary embodiment in which the impurity to be diffused is made available as an impurity layer 20 on the surface 40 of the semiconductor body 10. With the use of platinum as impurity, it is possible, by way of example, to produce the layer 20 by vapor deposition of a 5 nm to 50 nm thin platinum layer with subsequent formation of a platinum silicide layer at a temperature in the range of 250° C. to 450° C. during a time period of 30 min to 120 min. The diffusion of the platinum into the semiconductor body is then effected for example at a temperature in the range of 700° C. to 900° C. over a time period of 30 min to 4 h.

After the diffusion of the impurity into the semiconductor body 10, the impurity layer 20 is generally removed again from the surface 40.

Figure 3:
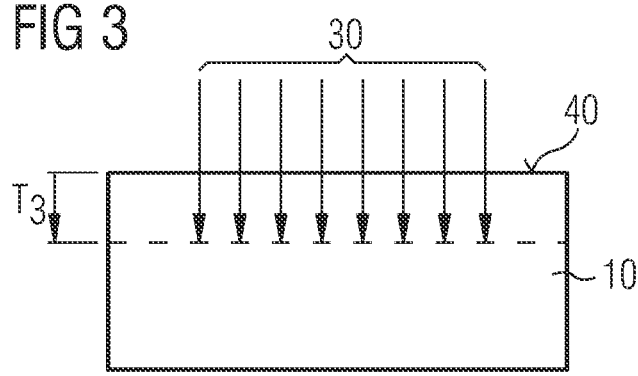
FIG. 3 is a schematic cross-sectional view illustrating one exemplary embodiment for the implantation of an impurity that forms an acceptor into the semiconductor body.

FIG. 3 illustrates another embodiment, in which the impurity is firstly implanted into the semiconductor body 10 through the surface 40. This is indicated by arrows 30 from FIG. 3. The implantation 30 is effected into a maximum depth T3 into the semiconductor body 10, wherein the depth T3 is less than the depth T1 of the later pn junction 13. After the implantation 30, the impurity is outdiffused in the first direction x, with the result that, possibly after the hydrogen implantation, the p-conducting zone 11 is formed with the shallow gradient of the acceptor concentration $N_A$ in the first direction x.

Figure 4:
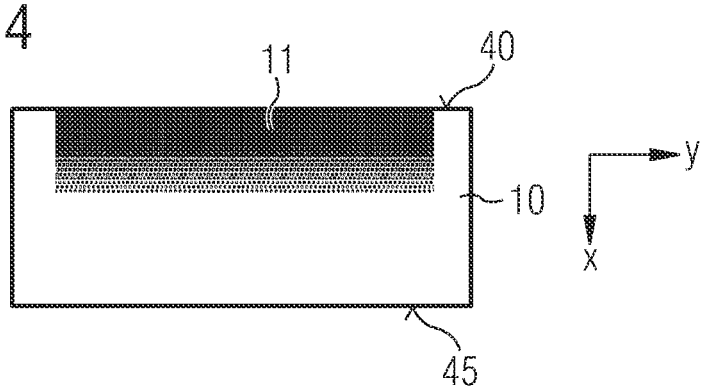
FIG. 4 is a schematic cross-sectional view illustrating one exemplary embodiment of a locally delimited p-conducting zone in the semiconductor body.

FIG. 4 illustrates an exemplary embodiment in which the p-doped zone 11 is produced only in locally delimited fashion into the semiconductor body 10. The local delimitation can be produced for example either by local delimitation of the impurity layer 20 on the semiconductor body 10 or by a masked implantation 30 of the impurity into the semiconductor body 10. An oxide mask, for example, can be used for the local delimitation of the impurity layer 20. During the subsequent diffusion of the initially locally delimited impurity into the semiconductor body 10, a lateral diffusion of the impurity in the semiconductor body can also occur. As a result, a diffusion profile also arises in a lateral direction, that is to say in a direction y perpendicular to the first direction x. This results in a laterally inhomogeneous impurity distribution and thus a laterally inhomogeneous acceptor concentration $N_A$ of the p-conducting zone 11 in the semiconductor body 10. In this case, the temperature and duration of the diffusion process will generally be set, on the one hand, such that the vertical diffusion of the impurities is effected to the extent necessary for the desired depth T1 of the pn junction 13. On the other hand, the parameters of the diffusion process are chosen such that the lateral diffusion is kept as small as possible.

The lateral spreading of the acceptor distribution can be kept very small, particularly in the case of an acceptor that arises in combination with a hydrogen implantation, if the acceptor formation is dominated by vacancies or vacancy defects since these have a low diffusion coefficient in silicon in comparison with the hydrogen.

In the case of such locally delimited production of the p-conducting zone 11, a laterally inhomogeneous pn junction 13 can be created. For this purpose, by way of example, after the local production of the p-conducting zone 11, a whole-area, unmasked proton implantation with the subsequent heat treatment is carried out on the semiconductor body. The resultant n-conducting zone 12 having a laterally homogeneous donor concentration $N_D$ forms, together with the laterally inhomogeneous acceptor concentration $N_A$ of the p-conducting zone 11, the laterally inhomogeneous pn junction 13. One embodiment involves the n-conducting zone 12 extending laterally from the locally delimited p-conducting zone 11 from the depth T2 as far as the surface 40. Particularly in the lateral edge region of the semiconductor body 10, such a structure may be advantageous in order, by way of example, to form a deeply situated channel stopper that enables a sufficient blocking capability of a semiconductor component sought. Other locally delimited structures can likewise be realized.

Figure 5:
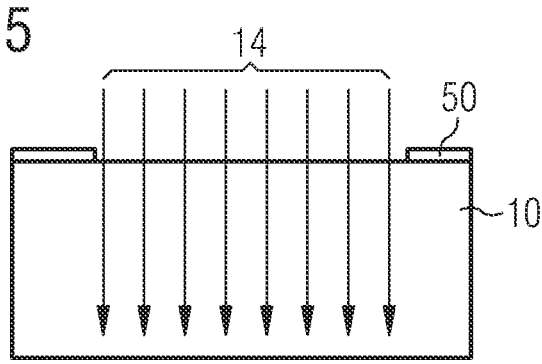
FIG. 5 is a schematic cross-sectional view, illustrating one exemplary embodiment of a masked proton implantation.

FIG. 5 illustrates one embodiment for fabricating a local delimitation of the n-conducting zone 12. For this purpose, the implantation 14 of the protons into the semiconductor body 10 is carried out in a manner delimited by a mask 50. The mask 50 used can be, for example, a stencil mask, that is to say a thin silicon mask, which absorbs the protons, or a metal mask applied on the semiconductor body 10. The mask 50 is generally removed again after the implantation 14 of the protons. A laterally delimited pn junction 13 can be produced, for example, by using the local delimitation of the n-conducting zone 12. In one embodiment, the laterally delimited pn junction 13, given the presence of a laterally homogeneous acceptor concentration of the p-conducting zone 11, can be formed in a laterally homogeneous fashion.

Figure 6:
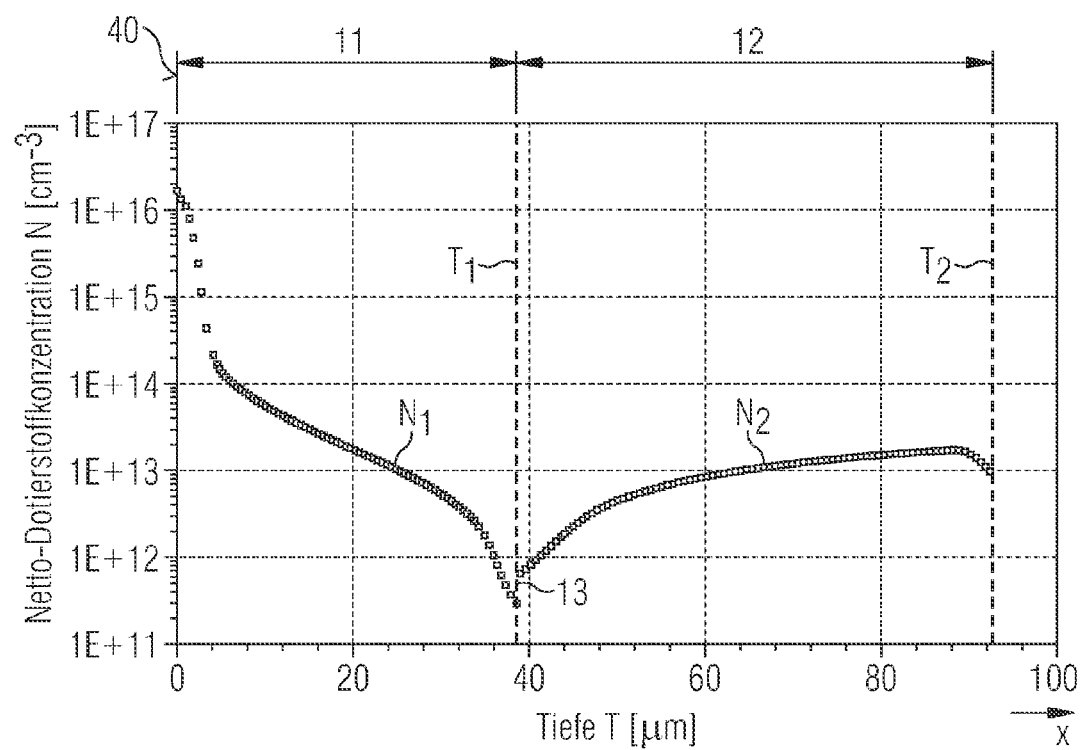
FIG. 6 illustrates an exemplary profile of a net concentration of acceptors and donors of a semiconductor body with a gradient that is shallow on both sides at the pn junction.

FIG. 6 illustrates an exemplary acceptor-donor profile in the semiconductor body 10. For this purpose, in FIG. 6, the net acceptor-donor concentration N on a logarithmic scale is plotted against the depth T of the semiconductor body 10. The net acceptor-donor concentration N should be understood here to mean the absolute value of the difference between the donor concentration $N_D$ and the acceptor concentration $N_A$.

The acceptor-donor profile in FIG. 6 illustrates a net acceptor-donor concentration $N_1=N_A$ of the p conduction type in the p-conducting zone 11 and a net acceptor-donor concentration $N_2=N_D$ of the n conduction type in the n-conducting zone 12. The p-conducting zone 11 extends from a first surface 40, which corresponds to the depth T=0, of the semiconductor body 10 as far as the pn junction 13 at the depth T1. A great elevation of the acceptor concentration is evident at the surface 40, which can be attributed to a p-type dopant implantation near the surface. The net acceptor-donor concentration $N_1$ has a relatively shallow profile proceeding toward the pn junction 13, that is to say a profile with a maximum change $\Delta N_1$ in the net acceptor-donor concentration $N_1$ by the factor 10 over a distance of approximately 5 μm in the vicinity of the pn junction 13, wherein this maximum change in the p-conducting zone 11 is applicable at least over a section S=½ T1 in the first direction x, which corresponds to half the extent of the p-conducting zone 11. The n-conducting zone 12 extends from the pn junction 13 at the depth T1 as far as a depth T2, which corresponds to the "End-of-Range" of the proton implantation 14 in the semiconductor body 10. The net acceptor-donor concentration $N_2$ of the n-conducting zone 12 likewise has a very shallow profile proceeding toward the pn junction 13, that is to say a profile with a maximum change $\Delta N_2$ in the net acceptor-donor concentration $N_2$ by the factor 10 over approximately 10 μm in the vicinity of the pn junction 13, wherein this maximum change $\Delta N_2$ in the n-conducting zone 12 is applicable at least over a section S=(T2−T1)/2 in the second direction −x, which corresponds to half the extent of the n-conducting zone 12.

Independently of the specific acceptor-donor profile, the dimensioning of the semiconductor body 10 can go beyond a depth T2. In the case of a semiconductor body 10 having a p-type basic doping, this results in a pnp structure (p-conducting zone 11, n-conducting zone 12, p-type basic doping).

Another embodiment may provide for the semiconductor body 10 to be thinned at the second surface 45, lying opposite the first surface 40, in the second direction −x as far as T2 or even right into the region between T2 and T1. In this case, the n-conducting zone 12 of the resultant semiconductor body 10 extends from the pn junction 13 as far as the second surface 45 of the semiconductor body 10.

Figure 7:
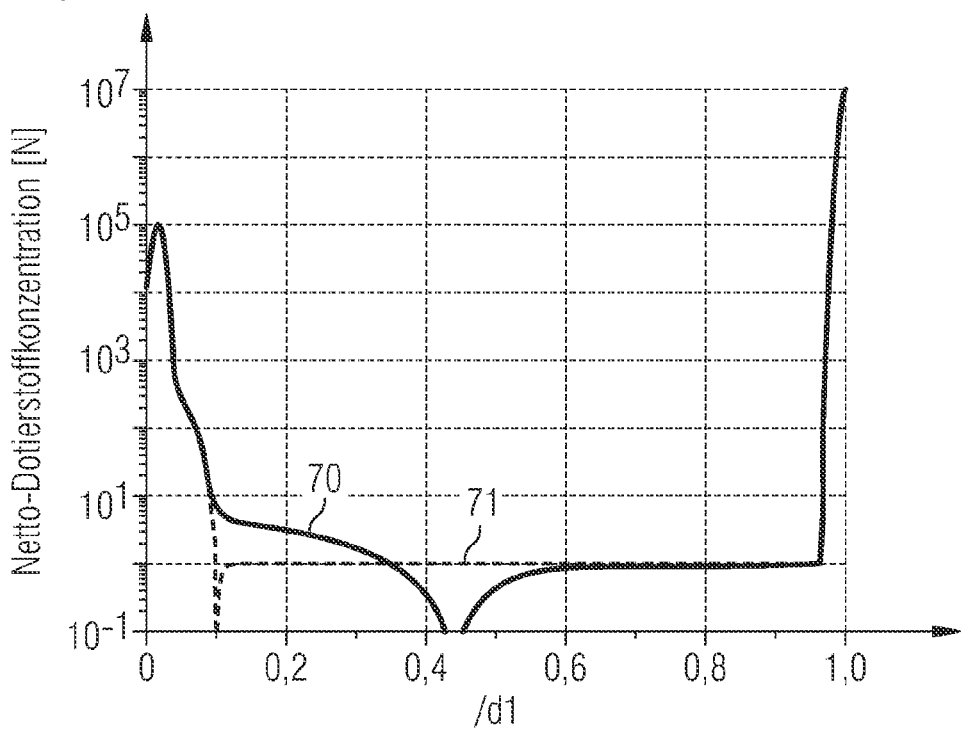
FIG. 7 illustrates one exemplary profile of a net concentration of acceptors and donors of a diode with a gradient that is shallow on both sides at the pn junction in comparison with a conventional diode.

FIG. 7 illustrates another exemplary profile of the net acceptor-donor concentration N in a semiconductor body of a diode. For this purpose, FIG. 7 illustrates the net acceptor-donor concentration N of a conventional diode with a steep gradient at the pn junction on the basis of the dashed line 71, while the net acceptor-donor concentration N of an improved diode with a deep pn junction and with a shallow gradient of the net acceptor-donor concentration at the pn junction is illustrated as line 70.

Figure 8:
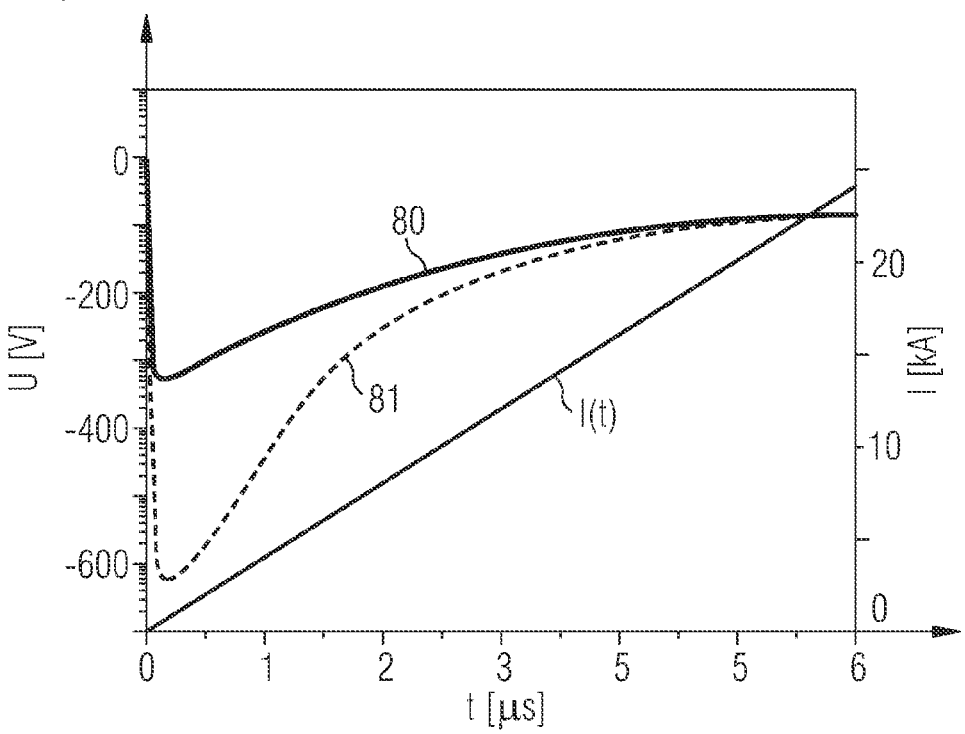
FIG. 8 illustrates one temporal profile of the diode voltage of a diode with a shallow doping gradient at the pn junction in comparison with the temporal profile of the diode voltage of a conventional diode, in each case during the switch-on operation and assuming a constant current rise.

As the result of a simulation, the temporal profile 81 of the diode voltage U of a conventional diode and the temporal profile 80 of the diode voltage U of an improved diode with a deep pn junction and with a shallow gradient of the net acceptor-donor concentration are compared with one another in FIG. 8. The diodes have the acceptor-donor profiles correspondingly illustrateillustrated in FIG. 7. In both diodes, the temporal rise in the diode current I(t) was chosen to be constant and identical in magnitude. It can be discerned that, in the case of a conventional diode, a negative voltage peak occurs which has a magnitude of greater than 600 V, while the magnitude of the corresponding negative voltage peak of the improved diode with a deep pn junction and shallow gradient is only somewhat more than 300 V.

Further exemplary embodiments (not illustrated) can provide the use of a semiconductor body 10 fabricated according to the method described above for an IGBT, a thyristor or some other power semiconductor component. In one embodiment, it should be noted that the above-described heat treatment of the semiconductor body 10 for forming hydrogen-induced donors is generally preferably performed before a deposition of metallizations on the semiconductor body 10. The heat treatment could otherwise have a harmful effect on the metallization. Furthermore, one embodiment variant may provide for a maximum donor concentration $N_D$ at the "End-of-Range", that is to say at the depth T2, to be used as a field stop zone for corresponding vertical power semiconductor components.

It is to be understood that the features of the various exemplary embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for fabricating a semiconductor comprising:
providing a semiconductor body having a p-conducting zone, having an n-conducting zone and having a pn junction in a depth T1 in the semiconductor body between the p-conducting zone and the n-conducting zone,
producing the p-conducting zone by the diffusion of an impurity that forms an acceptor in a first direction from a first surface of the semiconductor body into the semiconductor body,
producing the n-conducting zone by the implantation of protons via the first surface of the semiconductor body in the first direction into the semiconductor body into a depth T2 >T1 and the subsequent heat treatment of the semiconductor body forming hydrogen-induced donors,
wherein the impurity forms an acceptor in combination with a proton implantation.

2. The method of claim 1, comprising providing the impurity as a layer on the semiconductor body.

3. The method of claim 1, comprising implanting the impurity prior to the diffusion into a depth T3 <T1 into the semiconductor body.

4. The method of claim 1, comprising defining the impurity as platinum.

5. The method of claim 1, wherein the impurity is a rapidly diffusing heavy metal.

6. The method of claim 5, wherein the diffusion of the impurity is carried out at a temperature in the range of 700° C. to 1000° C.

7. A method for fabricating a semiconductor comprising:
providing a semiconductor body having a p-conducting zone, having an n-conducting zone and having a pn junction in a depth T1 in the semiconductor body between the p-conducting zone and the n-conducting zone,
producing the p-conducting zone by the diffusion of an impurity that forms an acceptor in a first direction from a first surface of the semiconductor body into the semiconductor body,
producing, after producing the p-conducting zone, the n-conducting zone by the implantation of protons via the first surface of the semiconductor body in the first direction into the semiconductor body into a depth T2 >T1 and the subsequent heat treatment of the semiconductor body forming hydrogen-induced donors;
wherein the p-conducting zone is locally delimited in the semiconductor body; and
wherein the impurity forms an acceptor in combination with a proton implantation.

8. The method of claim 7, wherein the local delimitation is effected by providing the impurity in a locally delimited manner.

9. The method of claim 7, wherein the implantation of the protons is carried out with an implantation dose in the range of $1 \times 10^{14}$ cm$^{-2}$ to $2 \times 10^{15}$ cm$^{-2}$.

10. The method of claim 7, comprising using a mask to locally delimit the implantation of the protons.

11. The method of claim 7, wherein the heat treatment of the semiconductor body for producing the n-conducting zone is effected with a temperature in the range of between 450° C. and 550° C.

12. The method of claim 7, wherein the heat treatment of the semiconductor body for producing the n-conducting zone is effected over a time period in the range of 30 min to 12 h.

13. The method of claim 7, wherein the semiconductor body is provided in a manner having a p-type basic doping.

14. The method of claim 13, wherein the concentration of the p-type basic doping is less than $1 \times 10^{15} cm^{-3}$.

15. The method of claim 7, wherein the depth T1 of the pn junction is more than 15 μm.

16. The method of claim 7, wherein the depth T1 of the pn junction corresponds to more than 20% of the extent of the semiconductor body in the first direction.

17. The method of claim 7, wherein the depth T1 of the pn junction corresponds to more than 40% of the extent of the semiconductor body in the first direction.

18. A method for fabricating a semiconductor comprising:
providing a semiconductor body having a p-conducting zone, having an n-conducting zone and having a pn junction in a depth T1 in the semiconductor body between the p-conducting zone and the n-conducting zone,
producing the p-conducting zone by the diffusion of an impurity that forms an acceptor in a first direction from a first surface of the semiconductor body into the semiconductor body,
producing, after producing the p-conducting zone, the n-conducting zone by the implantation of protons via the first surface of the semiconductor body in the first direction into the semiconductor body into a depth T2 >T1 and the subsequent heat treatment of the semiconductor body forming hydrogen-induced donors;
wherein the semiconductor body is thinned at a second surface opposite the first surface in a second direction opposite the first direction at least as far as the depth T2; and
wherein the impurity forms an acceptor in combination with a proton implantation.

19. The method as claimed in claim 18, wherein the semiconductor body is thinned right into the n-conducting zone in the region between T1 and T2.

20. A method for fabricating a semiconductor comprising:
providing a semiconductor body having a p-conducting zone, having an n-conducting zone and having a pn junction in a depth T1 in the semiconductor body between the p-conducting zone and the n-conducting zone,
producing the p-conducting zone by the diffusion of an impurity that forms an acceptor in a first direction from a first surface of the semiconductor body into the semiconductor body,
producing, after producing the p-conducting zone, the n-conducting zone by the implantation of protons via the first surface of the semiconductor body in the first direction into the semiconductor body into a depth T2 >T1 and the subsequent heat treatment of the semiconductor body forming hydrogen-induced donors;
wherein the p-conducting zone has a net acceptor-donor concentration $N_1$ having a maximum change $\Delta N_1$ by the factor over a distance of 5 μm at the pn junction; and
wherein the impurity forms an acceptor in combination with a proton implantation.

21. The method of claim 20, wherein the maximum change in the p-conducting zone is applicable at least over a section $S = 1;2\ T1$ in the first direction.

22. The method of claim 20, wherein the n-conducting zone has a net acceptor-donor concentration $N_2$ having a maximum change $\Delta N_2$ by the factor over a distance of 10 μm at the pn junction.

23. The method of claim 21, wherein the maximum change in the n-conducting zone is applicable at least over a section $S = (T2-T1)/2$ in the second direction.

* * * * *